(12) United States Patent
Hamaya et al.

(10) Patent No.: US 10,095,117 B2
(45) Date of Patent: Oct. 9, 2018

(54) IMPRINT APPARATUS

(71) Applicant: CANON KABUSHIKI KAISHA, Tokyo (JP)

(72) Inventors: Zenichi Hamaya, Utsunomiya (JP); Noriyasu Hasegawa, Utsunomiya (JP); Setsuo Yoshida, Saitama (JP); Yoshihiro Shiode, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/191,715

(22) Filed: Jun. 24, 2016

(65) Prior Publication Data

US 2016/0306281 A1    Oct. 20, 2016

Related U.S. Application Data

(62) Division of application No. 13/603,575, filed on Sep. 5, 2012, now Pat. No. 9,400,426.

(30) Foreign Application Priority Data

Sep. 7, 2011  (JP) .................................. 2011-194583
May 15, 2012 (JP) .................................. 2012-111419

(51) Int. Cl.
  *G03F 7/00* (2006.01)
  *G03F 7/20* (2006.01)
  (Continued)

(52) U.S. Cl.
  CPC .............. *G03F 7/70* (2013.01); *B29C 59/002* (2013.01); *B29C 59/022* (2013.01); *B82Y 10/00* (2013.01);
  (Continued)

(58) Field of Classification Search
  CPC ........................ G03F 7/0002; B29C 2059/023
  See application file for complete search history.

(56) References Cited

U.S. PATENT DOCUMENTS 6,137,562 A   10/2000 Masuyuki et al.
6,900,881 B2   5/2005 Sreenivasan et al.
(Continued)

FOREIGN PATENT DOCUMENTS

EP     1958025 B1     5/2011
JP     2009518207 A   5/2009
JP     2010221374 A   10/2010

OTHER PUBLICATIONS

Office Action issued in Japanese Appln. No. 2012-111419 dated Mar. 15, 2016.
(Continued)

*Primary Examiner* — Benjamin A Schiffman
(74) *Attorney, Agent, or Firm* — Rossi, Kimms & McDowell LLP

(57) ABSTRACT

An imprint apparatus molds an uncured resin on a substrate and cures the resin to form a pattern of the cured resin on the substrate. The apparatus includes a mold holding unit that holds the mold, a substrate holding unit that holds the substrate, a deforming unit that deforms the mold held by the mold holding unit into a convex shape toward the substrate, a driving unit that changes an attitude of the mold or the substrate during a releasing operation in which the mold deformed into the convex shape is released from the resin to thereby make the position of a contact region at which the mold is brought into contact with the resin movable, a measuring unit that acquires image information indicating a state of the contact region, and a control unit configured to control the operation of the driving unit based on the image information.

18 Claims, 10 Drawing Sheets

(51) Int. Cl.
*B29C 59/02* (2006.01)
*B82Y 10/00* (2011.01)
*B82Y 40/00* (2011.01)
*B29C 59/00* (2006.01)

(52) U.S. Cl.
CPC ............ *B82Y 40/00* (2013.01); *G03F 7/0002* (2013.01); *B29C 2059/023* (2013.01); *B29K 2909/08* (2013.01)

(56) References Cited

U.S. PATENT DOCUMENTS

| | | | |
|---|---|---|---|
| 7,691,313 B2 | 4/2010 | Choi et al. | |
| 8,444,889 B2 | 5/2013 | Tokue et al. | |
| 8,652,393 B2 * | 2/2014 | Khusnatdinov | B82Y 10/00 264/293 |

OTHER PUBLICATIONS

Office Action issued in U.S. Appl. No. 13/603,575 dated May 18, 2015.
Office Action issued in U.S. Appl. No. 13/603,575 dated Oct. 16, 2015.
Notice of Allowance issued in U.S. Appl. No. 13/603,575 dated Mar. 29, 2016.

* cited by examiner

IMPRINT APPARATUS

BACKGROUND OF THE INVENTION

Field of the Invention

The present invention relates to an imprint apparatus and an article manufacturing method using the same.

Description of the Related Art

As the demand for microfabrication of semiconductor devices or MEMS increases, not only a conventional photolithography technology but also a microfabrication technology in which an uncured resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot region (imprint region) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

Since the internal atmosphere of the imprinting apparatus employing the aforementioned technology is basically gas (ambient air), air bubbles may be entrapped in a resin when a mold is pressed against the resin on a substrate. If the resin is cured with air bubbles entrapped therein, there is a high probability that defects will occur in the pattern to be formed. In order to avoid the occurrence of such pattern defects, Japanese Patent Laid-Open No. 2009-518207 discloses a method for removing gas between a mold and a resin in which the mold is temporarily deflected into a convex shape toward the substrate, a resin on the substrate is pressed against the mold in this state, and the mold is gradually restored to a flat surface so as to press the entire pattern surface against the resin. According to the method, gas present between the mold and the resin may be discharged from the inside to the outside, and thus, air bubbles entrapped in a resin may be reduced.

Furthermore, in the conventional imprint apparatus, if the mold is entirely released from the resin at one time, a large releasing stress is momentarily applied to the interface (contact portion) between the mold and the cured resin. Such a stress may cause distortion of the pattern to be formed in the resin, resulting in defects in the pattern. In contrast, in the apparatus disclosed in Japanese Patent Laid-Open No. 2009-518207, the mold is temporarily deflected into a convex shape when the mold is released from the resin in the same manner as when the mold is pressed against the resin. With this arrangement, the mold is gradually released from the periphery toward the center of the pattern-formed region of the cured resin. Consequently, the force required for a mold releasing is made smaller than that when no deflection is produced in the mold, and thus, the abrupt occurrence of stress can be avoided.

Here, as with the apparatus disclosed in Japanese Patent Laid-Open No. 2009-518207, if the mold is gradually deformed and released from the periphery toward the center of the pattern-formed region of the cured resin, the contact region between the mold and the resin gradually decreases and eventually disappears when the mold is completely released from the resin. However, the centroid of the contact region may be displaced from the center of the pattern-forming region in the course of the releasing operation depending on the deflection state of the mold or the layout of the pattern formed in the mold. Thus, if the position of the contact region is offset in the XY plane as described above, warpage of the mold increases at the portion where the distance between the boundary of the contact region and the end of the pattern-forming region to is close. The inclination of the concave and convex pattern (pattern section) formed in the mold increases with an increase of warpage of the mold. Consequently, the concave and convex pattern formed in the mold may be in contact with the pattern formed over the resin, resulting in the occurrence of defects such as pattern deformation, pattern damage, or the like.

SUMMARY OF THE INVENTION

Accordingly, the present invention provides an imprint apparatus which is advantageous for suppressing the occurrence of pattern defects.

According to an aspect of the present invention, an imprint apparatus that molds an uncured resin on a substrate using a mold and cures the resin to thereby form a pattern of the cured resin on the substrate is provided that includes a mold holding unit configured to hold the mold; a substrate holding unit configured to hold the substrate; a deforming unit configured to deform the mold held by the mold holding unit into a convex shape toward the substrate; a driving unit configured to change an attitude of the mold or the substrate during a releasing operation in which the mold that has been deformed into the convex shape is released from the resin to thereby make the position of a contact region at which the mold is brought into contact with the resin movable; a measuring unit configured to acquire image information indicating a state of the contact region; and a control unit configured to control the operation of the driving unit based on the image information.

According to the present invention, an imprint apparatus which is advantageous for suppressing the occurrence of pattern defects may be provided.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.
(First Embodiment)

Figure 1:
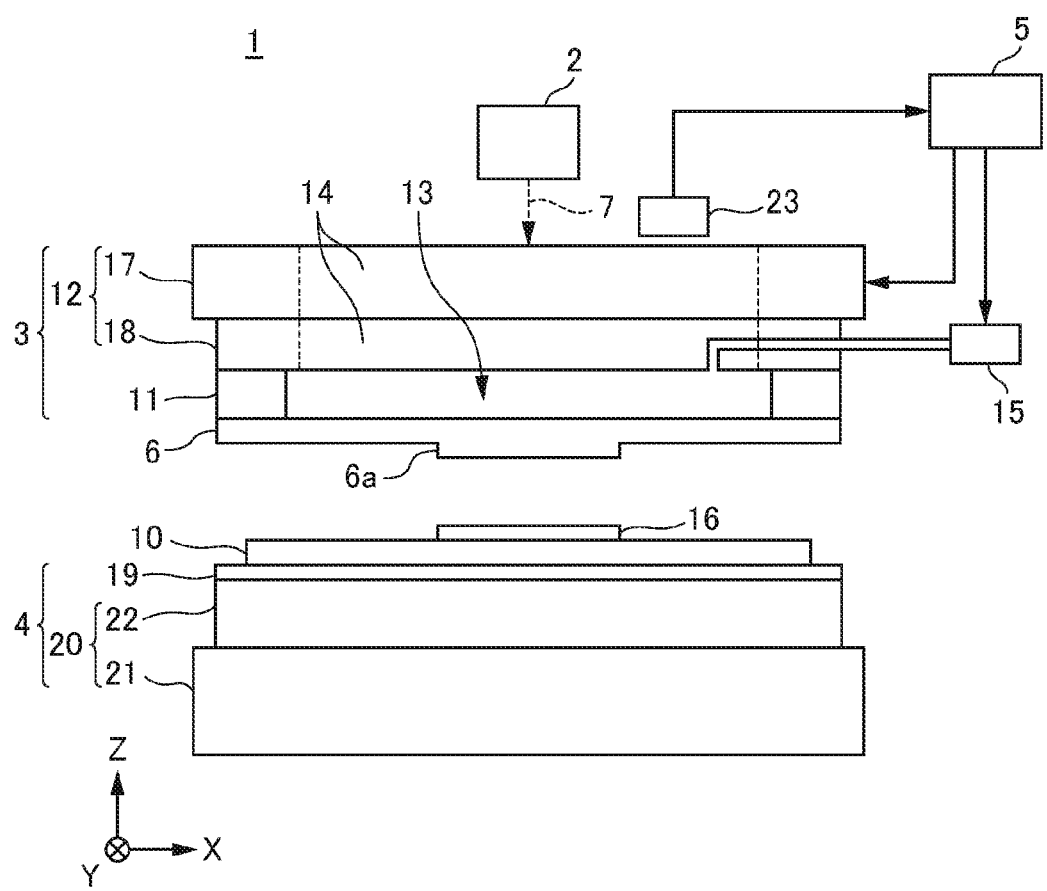
FIG. 1 is a diagram illustrating the configuration of an imprint apparatus according to a first embodiment of the present invention.

Firstly, a description will be given of an imprint apparatus according to a first embodiment of the present invention. FIG. 1 is a diagram illustrating the configuration of an imprint apparatus. The imprint apparatus of the present embodiment is an apparatus that molds an uncured resin on a wafer (on a substrate), i.e., a substrate to be treated, using a mold to thereby form a resin pattern on the wafer, which is used in the manufacture of devices such as semiconductor devices and the like as articles. Note that the imprint apparatus of the present embodiment is an apparatus employing a photo-curing method. In the following drawings, a description will be given where the Z axis is aligned parallel to the optical axis of an irradiation system that irradiates ultraviolet light onto a resin on a wafer, and mutually orthogonal axes X and Y are aligned in directions in a plane perpendicular to the Z axis. Firstly, an imprint apparatus 1 includes a light irradiation unit 2, a mold holding mechanism 3, a wafer stage 4, an application unit, and a control unit 5.

The light irradiation unit 2 irradiates a mold 6 with ultraviolet light 7 during imprint processing. The light irradiation unit 2 is constituted by a light source (not shown) and an optical element that adjusts the ultraviolet light 7 emitted from the light source to light suitable for imprinting. Note that, in the present embodiment, the light irradiation unit 2 is provided for employing a photo-curing method. If a thermosetting method is employed, a heat source unit for curing a thermosetting resin may be provided instead of the light irradiation unit 2.

The outer peripheral shape of the mold 6 is rectangular and the mold 6 includes a pattern section (e.g., the concave and convex pattern of a circuit pattern or the like to be transferred) 6a which is three-dimensionally formed on the surface facing a wafer 10. Also, the material of the mold 6 is a material such as quartz or the like through which the ultraviolet light 7 can pass. Furthermore, for ease of deformation as described below, the mold 6 may be of a shape in which a cavity (concave portion) of a circular planer shape having a certain depth is formed on the surface on which the ultraviolet light 7 is irradiated.

Firstly, the mold holding mechanism 3 has a mold chuck (mold holding unit) 11 that holds the mold 6 and a mold drive mechanism 12 that holds the mold chuck 11 and moves the mold 6 (the mold chuck 11). The mold chuck 11 may hold the mold 6 by suctioning/attracting the outer peripheral region of the surface of the mold 6 irradiated with the ultraviolet light 7 using a vacuum suction force/an electrostatic force. For example, if the mold chuck 11 holds the mold 6 using a vacuum suction force, the mold chuck 11 is connected to an externally installed vacuum pump (not shown), and attachment/detachment of the mold 6 is switched by turning the vacuum pump ON/OFF. Also, each of the mold chuck 11 and the mold drive mechanism 12 has an aperture region at the central portion (the inside thereof) such that the ultraviolet light 7 emitted from the light irradiation unit 2 is irradiated toward the wafer 10. A light transmission member (e.g. glass plate) 14 is installed within the aperture region such that a space 13 enclosed by a part of the aperture region and the mold 6 is sealed, and the pressure in the space 13 is adjusted by a pressure adjusting device (deforming unit) 15 including a vacuum pump or the like. The pressure adjusting device 15 sets the pressure in the space 13 higher than the external pressure when the mold 6 is pressed against a resin 16 on the wafer 10 so that the pattern section 6a is deflected into a convex shape toward the wafer 10 and the pattern section 6a is brought into contact with the resin 16 from the central portion of the pattern section 6a. With this arrangement, gas (air) is prevented from being entrapped between the pattern section 6a and the resin 16 so that the resin 16 can be filled in the every corner of the convex and concave portion of the pattern section 6a. While, in the present embodiment, the pressure adjusting device 15 serves as a deforming unit configured to deform a mold into a convex shape, the deforming unit is not limited to the pressure adjusting device 15 but may be any unit provided that it can deform a mold into a convex shape. Furthermore, the mold holding mechanism 3 has a magnification correction mechanism (not shown) that corrects the shape of the mold 6 (the pattern section 6a) by imparting an external force or displacement to the side surface of the mold 6. The magnification correction mechanism is installed at the mold 6-holding side of the mold chuck 11.

The mold drive mechanism 12 moves the mold 6 in each axis direction so as to selectively press the mold 6 against the resin 16 on the wafer 10 or release the mold 6 from the resin 16. The mold drive mechanism 12 is constituted by a coarse movement stage (coarse movement drive system) 17 and a fine movement stage (fine movement drive system) 18. The coarse movement stage 17 is driven a long distance mainly in the Z-axis direction. On the other hand, the fine movement stage 18 follows the coarse movement stage 17 and is finely driven mainly in six-axis (X, Y, Z, ωx, ωy, and ωz) directions. Examples of an actuator employable for the mold drive mechanism 12 include a linear motor, an air cylinder, and the like. The pressing operation and the releasing operation performed by the imprint apparatus 1 may be realized by moving the mold 6 in the Z-axis direction, may be realized by moving the wafer stage 4 in the Z-axis direction, or may also be realized by moving both the mold 6 and the wafer stage 4 relative to each other.

The wafer 10 is, for example, a single crystal silicon substrate or a SOI (Silicon on Insulator) substrate, and an ultraviolet curable resin (hereinafter referred to as "resin") 16, which is molded by the pattern section 6a formed in the mold 6, is applied on the treatment surface of the wafer 10.

The wafer stage (substrate holding unit) 4 holds the wafer 10 and executes position matching between the mold 6 and the resin 16 when the mold 6 is pressed against the resin 16 on the wafer 10. The wafer stage 4 has a wafer chuck 19 that holds the wafer 10 by a suction force and a stage drive mechanism 20 that holds the wafer chuck 19 by a mechanical unit and is movable in each axis direction. The stage drive mechanism 20 is also constituted by a coarse movement stage (coarse movement drive system) 21 and a fine movement stage (fine movement drive system) 22. In this case, the coarse movement stage 21 is driven a long distance mainly in the XY plane. On the other hand, the fine movement stage 22 follows the coarse movement stage 21 and is finely driven mainly in six-axis (X, Y, Z, ωx, ωy, and ωz)

directions. Examples of an actuator employable for the stage drive mechanism 20 include a linear motor, a planar motor, and the like.

The application unit (not shown) is installed near the mold holding mechanism 3 and applies the resin (uncured resin) 16 to the wafer 10. Here, the resin 16 is a photocurable resin (imprint material) having the property of being cured by receiving the irradiation of the ultraviolet light 7, and is appropriately selected depending on various conditions such as the manufacturing process of semiconductor devices or the like. The amount of the resin 16 to be ejected from the ejection nozzle of the application unit is also appropriately determined by a desired thickness of the resin 16 to be formed on the wafer 10, the density of the pattern to be formed, or the like. The "pattern-forming region (shot)" used in the following description has substantially the same area as that of the applied region of the resin 16 for convenience.

The control unit 5 may control the operation, adjustment, and the like of the components of the imprint apparatus 1. The control unit 5 is constituted by a computer or the like and is connected to the components of the imprint apparatus 1 through a line so as to execute control of the components by a program or the like. The control unit 5 of the present embodiment controls at least the operation of the driving unit such as the mold holding unit 3 or the like and the pressure adjusting device 15. Note that the control unit 5 may be integrated with the rest of the imprint apparatus 1 (provided in a shared housing) or may be provided separately from the rest of the imprint apparatus 1 (provided in a separate housing).

Also, the imprint apparatus 1 includes a measuring device (measuring unit) 23 that grasps the state of the contact region when the mold 6 (the pattern section 6a) is brought into contact with the resin 16 on the wafer 10. The measuring device (measuring unit) 23 is installed above the mold holding mechanism 3, that is, upstream of the direction in which the ultraviolet light 7 is irradiated. The measuring device 23 is an imaging device such as a CCD camera or the like, and acquires the contact region as image information in this case. Furthermore, the imprint apparatus 1 may also include an alignment measurement system, a mold conveyance mechanism that conveys the mold 6 from the exterior of the apparatus to the mold holding mechanism 3, a substrate conveyance mechanism that that conveys the wafer 10 from the exterior of the apparatus to the substrate conveyance mechanism, and the like, none of which are shown.

Next, a description will be given of imprint processing performed by the imprint apparatus 1. Firstly, the control unit 5 places and attaches the wafer 10 to the wafer chuck 19 on the wafer stage 4 using the substrate conveyance mechanism, and then moves the wafer stage 4 to the application position of the application unit. Next, as an application step, the application unit applies the resin 16 to a pattern-forming region which is a predetermined area to be processed of the wafer 10. Next, the control unit 5 moves the wafer stage 4 such that the pattern-forming region on the wafer 10 is placed in a position directly below the pattern section 6a formed in the mold 6. Next, the control unit 5 drives the mold drive mechanism 12 so as to press the mold 6 against the resin 16 on the wafer 10 (mold-pressing step). By pressing the mold 6 against the resin 16 on the wafer 10, the resin 16 is filled in the convex and concave portion of the pattern section 6a.

Under this condition, as a curing step, the control unit 5 causes the light irradiation device 2 to emit the ultraviolet light 7 from the top surface of the mold 6, and cures the resin 16 by the ultraviolet light 7 that has been transmitted through the mold 6. Then, after the resin 16 is cured, the control unit 5 drives the mold drive mechanism 12 again to thereby release the mold 6 from the resin 16 (mold-releasing step). By the aforementioned steps, a three dimensionally shaped pattern (layer) of the resin 16 following the convex and concave portion of the pattern section 6a is formed on the surface of the pattern-forming region on the wafer 10. Such a sequence of imprint operations is conducted two or more times while changing the pattern-forming region by driving the wafer stage 4 to thereby be able to form a plurality of patterns of the resin 16 on one wafer 10.

Figure 10A:
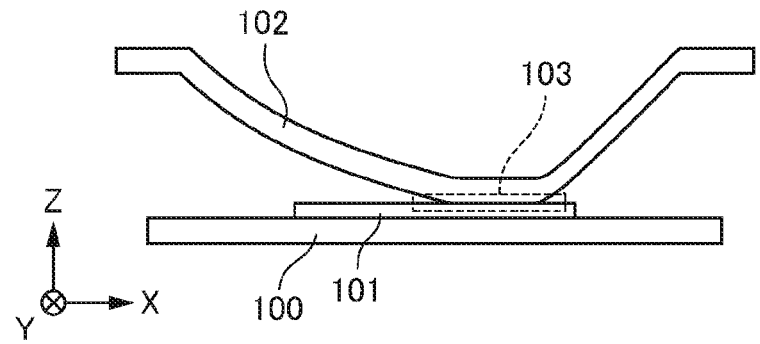
FIGS. 10A to 10C are diagrams illustrating the state of a conventional imprint apparatus in a mold-releasing step.
Figure 10B:
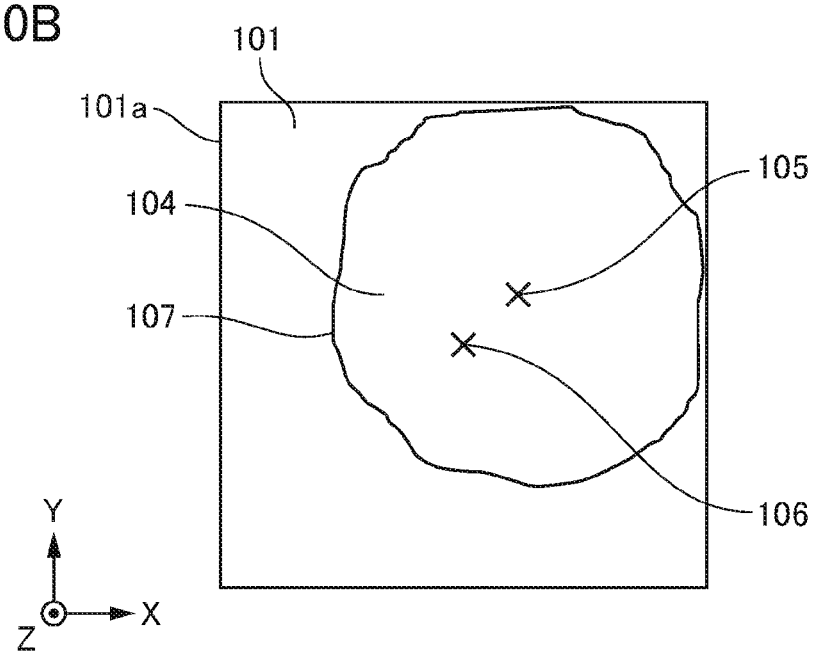
Figure 10C:
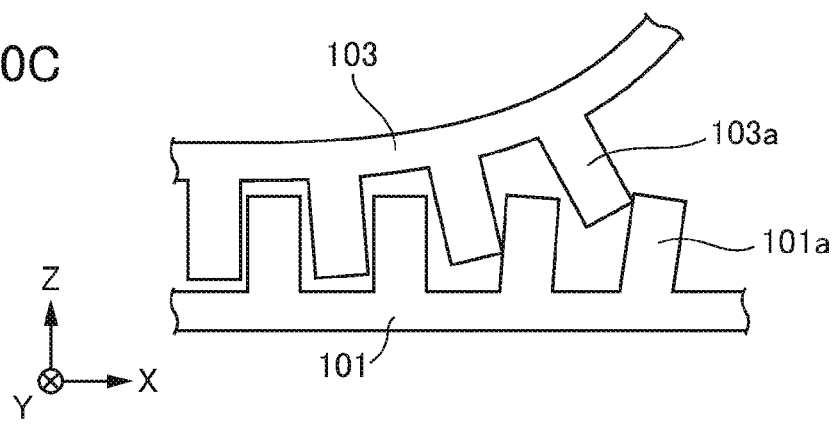

In particular, in the mold-pressing step and the mold-releasing step, the control unit 5 deforms (deflects) the mold 6 into a convex shape toward the wafer 10 by the pressure adjusting device 15 as described above. Here, for comparison, a description will be given of a releasing operation performed by a conventional imprint apparatus. FIGS. 10A to 10C are schematic diagrams illustrating the state of the conventional imprint apparatus during the releasing operation. In particular, FIG. 10A is a diagram illustrating the state in the course of releasing a mold 102 (a pattern section 103) from a resin layer 101, which is a pattern-forming region formed on the wafer 100 during the releasing operation. In general, when the mold 102 is released from the wafer 100, the mold 102 is subjected to a force in a direction away from the wafer 100, i.e., the upper direction along the Z axis. At the same time, in the contact region where the pattern section 103 is in contact with (fixedly attached to) the resin layer 101, the mold 102 is subjected to a releasing stress in a direction toward the wafer 100, i.e., the lower direction along the Z axis. Therefore, in the conventional imprint apparatus, the mold 102 is deformed into a convex shape toward the wafer 100 as shown in FIG. 10A, and thus, the pattern section 103 is gradually released from the periphery toward the center of the resin layer 101, resulting in avoiding the abrupt occurrence of a releasing stress. The contact region between the pattern section 103 and the resin layer 101 gradually decreases with the progress of the releasing operation, and eventually disappears when the pattern section 103 is completely released from the resin layer 101.

However, in the conventional imprint apparatus, depending on the deflection state of the mold 102 or the layout of the pattern formed in the mold 102, the centroid of the contact region may be displaced from the center of the resin layer 101 in the course of the releasing operation. FIG. 10B is a plan view illustrating the state of the contact region in such a case. For example, if the position of a contact region 104 is offset in the XY plane, that is, if the centroid 105 of the contact region 104 is displaced from the center 106 of the resin layer 101, warpage of the mold 102 increases at a portion where the distance between the boundary 107 of the contact region 104 and the end 101a of the resin layer 101 is close. The inclination of the pattern section 103 formed in the mold 102 also increases with an increase in warpage of the mold 102. FIG. 10C is an enlarged cross-sectional view illustrating the vicinity of the boundary 107 of the contact region 104. As described above, the concave and convex pattern 103a of the pattern section 103 may be in contact with a pattern 101a formed on the resin layer 101, resulting in the occurrence of defects such as deformation, damage, or the like of the pattern 101a. Accordingly, the imprint apparatus 1 of the present embodiment adjusts the position of the centroid of the contact region as appropriate during the releasing operation such that the position of the contact region is not offset in the XY plane.

Figure 2A:
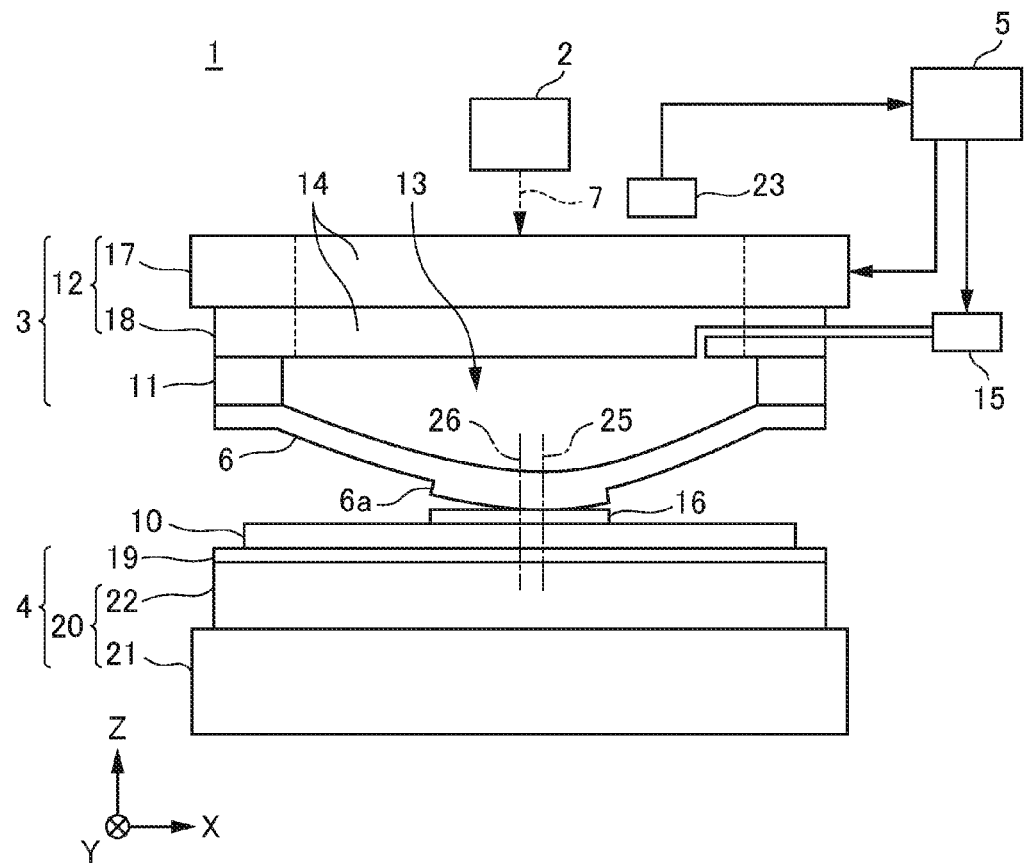
FIGS. 2A and 2B are diagrams illustrating the state of the imprint apparatus according to the first embodiment prior to the centroid adjustment.
Figure 2B:
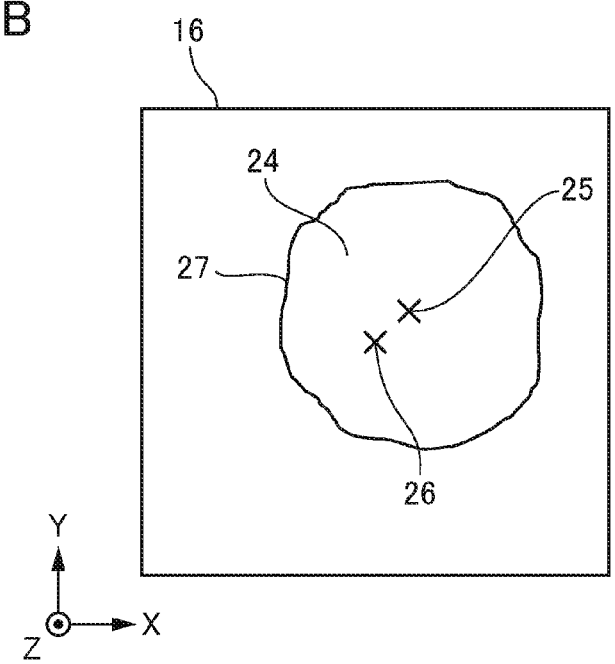
Figure 3:
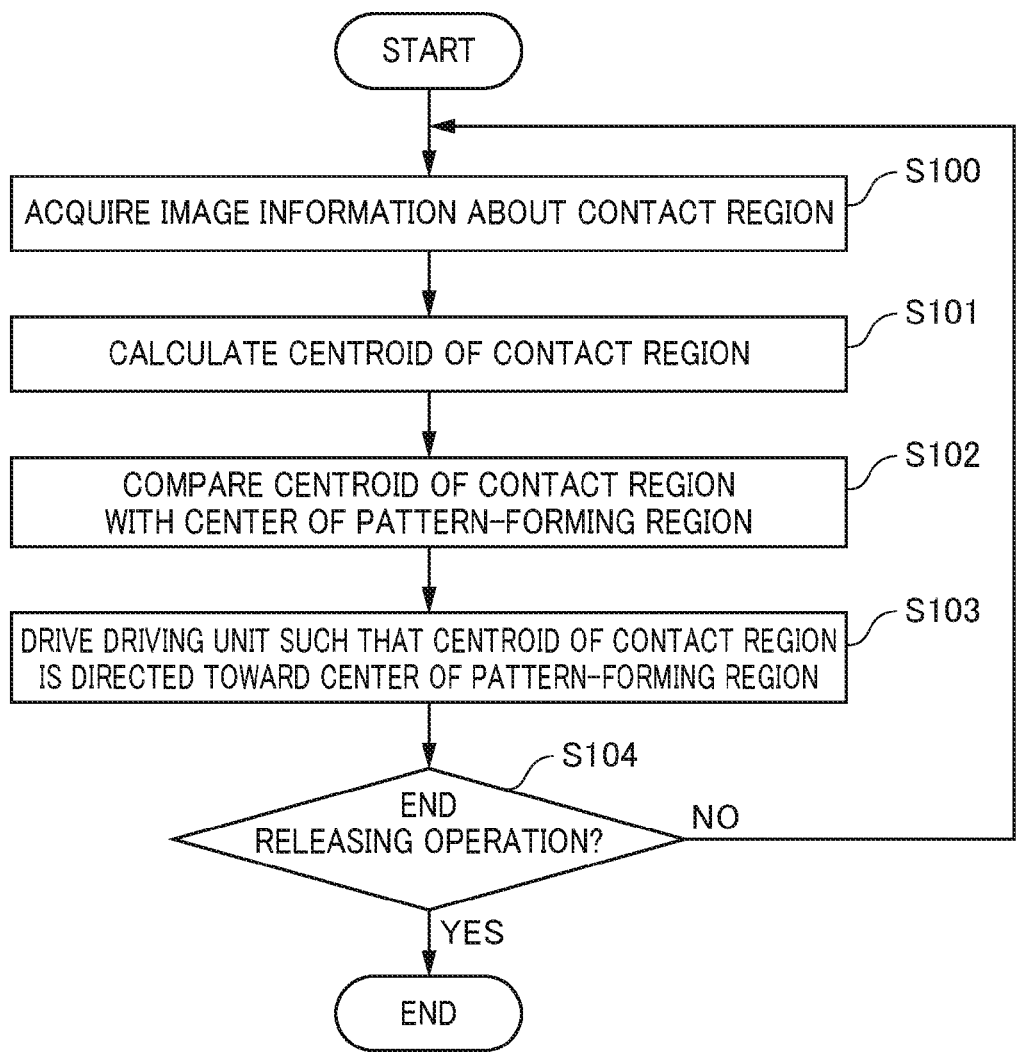
FIG. 3 is a flowchart illustrating the sequence of operation in a mold-releasing step.

FIGS. 2A and 2B are schematic diagrams illustrating the state of the contact region prior to the centroid adjustment in a mold-releasing step. In particular, FIG. 2A is a cross-sectional view illustrating the state of the imprint apparatus 1 corresponding to that shown in FIG. 1, where the mold 6 is in a deformed state, and FIG. 2B is a plan view illustrating the state of a contact region 24 between the pattern section 6a and the resin (resin layer) 16 at this time. Also, FIG. 3 is a flowchart illustrating the sequence of operations performed by the imprint apparatus 1 in the mold-releasing step. Firstly, in the mold-releasing step, the control unit 5 acquires image information about the contact region 24 using a measuring device 23 while the pattern section 6a is being released from the resin 16 (step S100). Next, the control unit 5 calculates the position (plane coordinates) of a centroid 25 of the contact region 24 based on the acquired image information (step S101). The position of the centroid 25 can be calculated by replacing the acquired area of the contact region 24 with, for example, a polygon, a circle, an ellipse, or the like as appropriate. Note that the control unit 5 calculates the area of the resin 16 applied on the wafer 10, that is, the position (plane coordinates) of a center 26 of the pattern-forming region prior to calculation of the centroid 25. Next, the control unit 5 compares the position of the calculated centroid 25 with that of the calculated center 26 (step S102). Then, the control unit 5 drives the fine movement stage 18, which is the drive system (driving unit) of the mold drive mechanism 12, such that the position of the centroid 25 is always directed toward (matched to) the position of the center 26 during the releasing operation (step S103). At this time, the control unit 5 changes the angles ωx and ωy around the XY axis of the mold holding surface in the fine movement stage 18 while moving the coarse movement stage 17 of the mold drive mechanism 12 upward in the Z-axis direction. Subsequently, the control unit 5 repeats the sequence of operations at a certain frequency (NO in step S104). If the control unit 5 determines that the releasing operation has been completed (YES in step S104), the sequence of operations is ended (step S104).

Figure 4A:
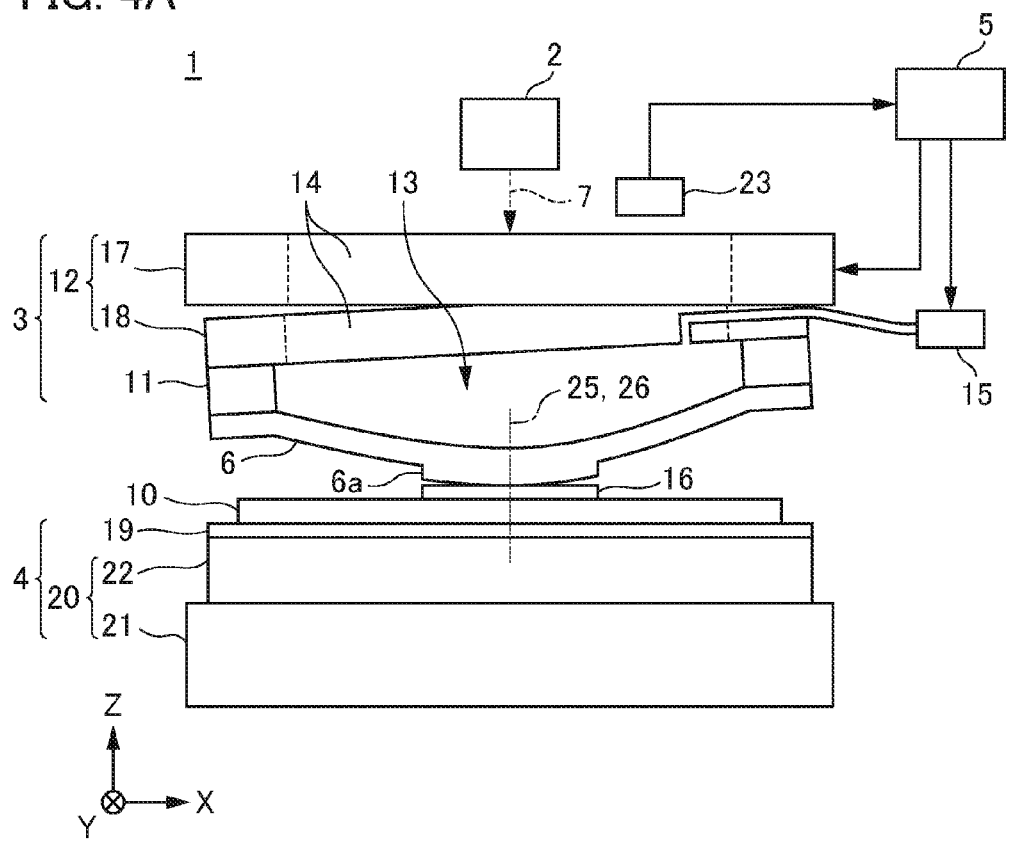
FIGS. 4A and 4B are diagrams illustrating the state of the imprint apparatus according to the first embodiment during the centroid adjustment.
Figure 4B:
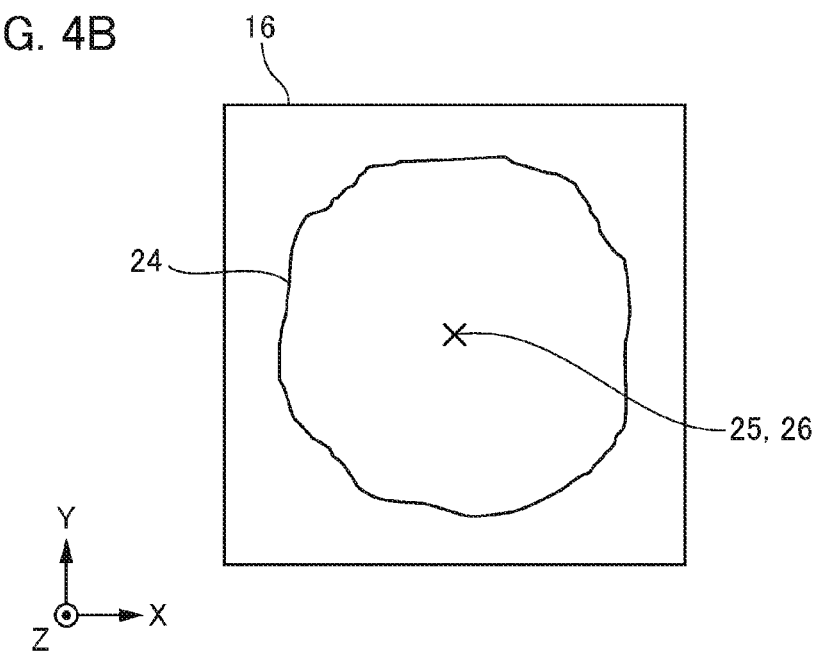

FIGS. 4A and 4B are schematic diagrams illustrating the state of the contact region during the centroid adjustment in a mold-releasing step. In particular, FIG. 4A is a cross-sectional view illustrating the state of the imprint apparatus 1 corresponding to that shown in FIG. 2, where the fine movement stage 18 is in a drive state, and FIG. 4B is a plan view illustrating the state of the contact region 24 between the pattern section 6a and the resin (resin layer) 16 at this time. For example, as shown in FIG. 4A, the control unit 5 changes the angle ωy around the Y axis of the mold holding surface of the mold 6 with respect to the fine movement stage 18 to thereby change the attitude of the mold 6 (the pattern section 6a) held by the fine movement stage 18 via the mold chuck 11. Here, the amount of change in each of the angles ωx and ωy is adjusted based on the offset amount between the centroid 25 and the center 26 in the XY plane. The control unit 5 adjusts the angles based on the calculated offset amount, and thus, the position of the centroid 25 is moved as shown in FIG. 4B so as to be matched with the position of the center 26. Also, the control unit 5 sets the calculation timing of the centroid 25 in advance such that the accuracy in controlling the position of the centroid 25 is ensured and the amount of change in the angle of the mold holding surface of the fine movement stage 18 is prevented from being excessively large. For example, if a pattern-forming region has the size of 20 mm×30 mm and a time required for releasing is 0.1 sec, it is preferable that the control unit 5 executes the calculation of the centroid 25 at intervals of 1 msec. The control unit 5 calculates the centroid 25 at such timing and feedback-controls the amount of change in the angle of the mold holding surface of the fine movement stage 18 so as to maintain the accuracy in controlling the position of the centroid 25.

Here, the driving force for the fine movement stage 18 required for mold releasing decreases with a decrease in the area of the contact region 24 as the releasing operation progresses. In contrast, when the control unit 5 controls the driving force for the fine movement stage 18 so as to be constant, the pattern section 6a may be rapidly peeled off from the resin 16 with decreasing the area of the contact region 24, resulting in the occurrence of pattern defects. Thus, it is preferable that the control unit 5 calculates the moving speed at a boundary 27 of the contact region 24 and controls the driving force for the fine movement stage 18 such that the moving speed is kept constant. In this case, even if the fine movement stage 18 is not driven such that the position of the centroid 25 is always directed toward the position of the center 26, the occurrence of pattern defects due to a rapid peel-off can be suppressed.

As described above, the fine movement stage 18 is driven such that the position of the centroid 25 is always directed toward the position of the center 26 during the releasing operation, and thus, the contact region 24 can be prevented from being offset in the XY plane. Thus, since the mold 6 is uniformly deflected from the center 26 in the mold-releasing step, the inclination of the pattern section 6a does not locally increase, and thus, the occurrence of pattern defects can be suppressed. Furthermore, since the contact region 24 gradually decreases without being located off-center in the XY plane as the releasing operation progresses, the moving speed at the boundary 27 of the contact region 24 becomes symmetrical based on the center 26. Thus, the moving speed of the contact region 24 does not become locally too high at the boundary 27 during the releasing operation. Consequently, a portion at which the pattern section 6a is rapidly peeled off from the resin 16 is not likely to occur, and thus, the occurrence of pattern defects can be suppressed from the viewpoint of such a mold-releasing speed.

As described above, according to the present embodiment, an imprint apparatus which is advantageous for suppressing the occurrence of pattern defects may be provided.

Although, in the present embodiment, the fine movement stage 18 on the mold 6 side is employed as a driving unit that drives the position of the centroid 25 of the contact region 24 so as to be directed toward the position of the center 26 of the resin 16, the fine movement stage 22 on the wafer 10 side may also be employed. In this case, the coarse movement stage 21 and the fine movement stage 22 of the stage drive mechanism 20 operate in accordance with the coarse movement stage 17 and the fine movement stage 18 of the mold drive mechanism 12, respectively, in the aforementioned description.

(Second Embodiment)

Figure 5A:
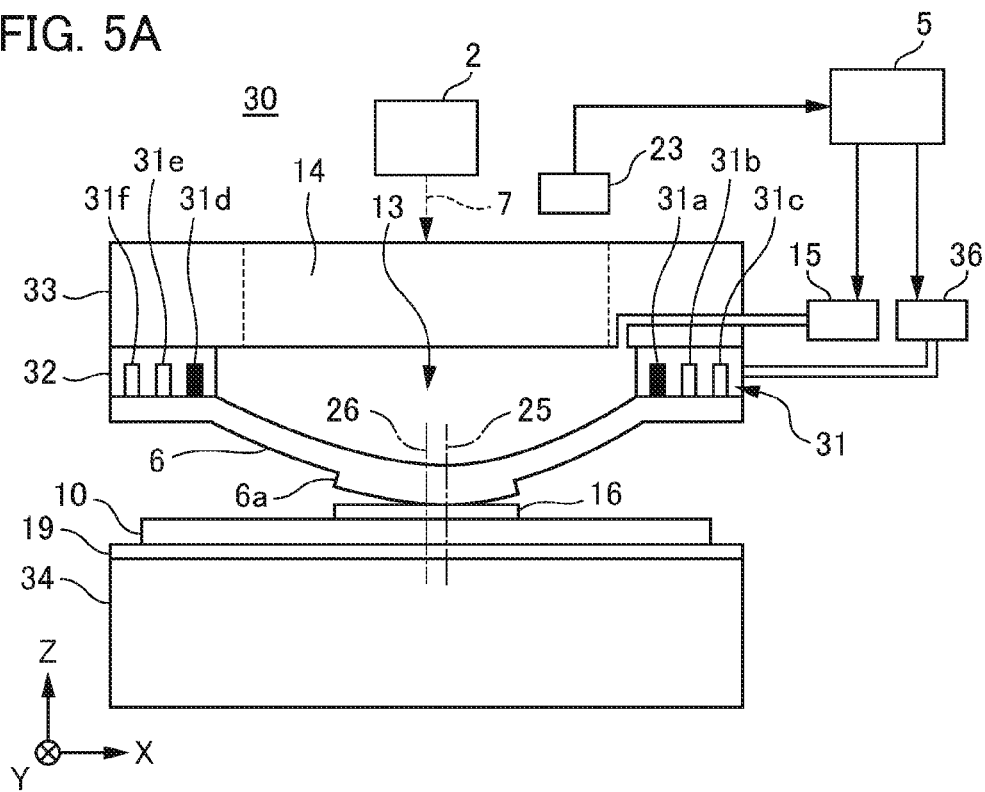
FIGS. 5A and 5B are diagrams illustrating the state of an imprint apparatus according to a second embodiment prior to the centroid adjustment.
Figure 5B:
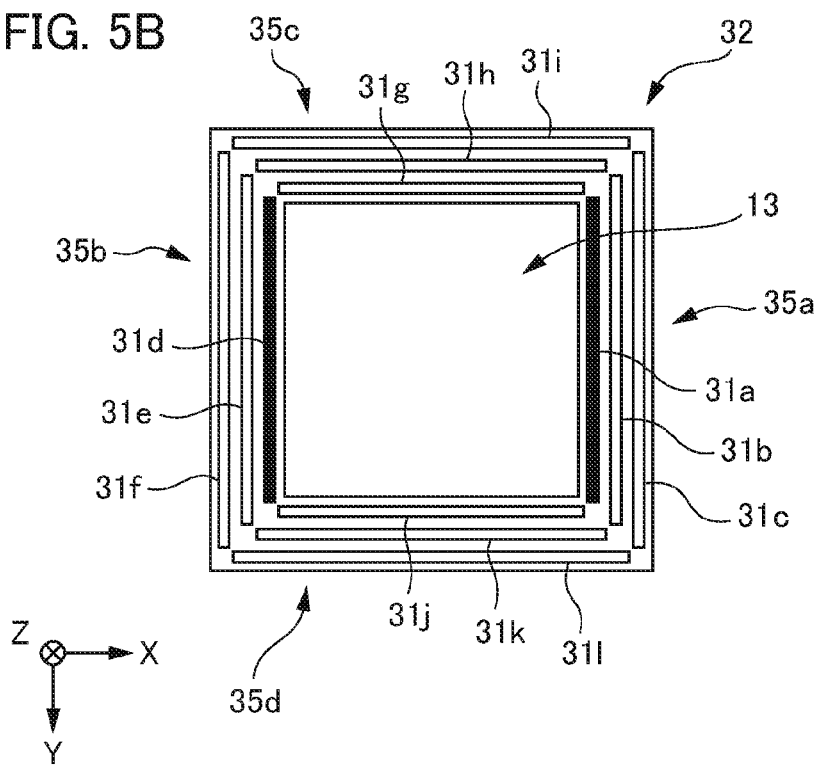

Next, a description will be given of an imprint apparatus according to a second embodiment of the present invention. FIGS. 5A and 5B are schematic diagrams illustrating the state of an imprint apparatus 30 according to the present embodiment prior to the centroid adjustment in a mold-releasing step. In particular, FIG. 5A is a cross-sectional view illustrating the configuration of the imprint apparatus 30. In FIG. 5, the same elements as those in the imprint apparatus 1 of the first embodiment shown in FIG. 1 are designated by the same reference numerals, and the explanation thereof will be omitted. A feature of the imprint apparatus 30 lies in the fact that a mold chuck 32 having a plurality of suction grooves 31 provided on the suction surface thereof is employed as a driving unit that drives the position of the centroid 25 of the contact region 24 so as to be directed toward the position of the center 26 of the resin 16. In this case, a mold drive mechanism 33 of the present embodiment, which corresponds to the mold drive mechanism 12 of the first embodiment, may be a unitary drive mechanism that is movable at least in the Z-axis direction instead of one having two drive systems which are a coarse movement stage and a fine movement stage. Likewise, a stage drive mechanism 34 of the present embodiment, which corresponds to the stage drive mechanism 20 of the first embodiment, may also be a unitary drive mechanism that is movable at least in the XY axis direction instead of one having two drive systems which are a coarse movement stage and a fine movement stage.

FIG. 5B is a plan view illustrating the configuration of a mold chuck 32 as seen from the mold 6 side and the suction state of the mold chuck 32 in this case. By way of example, the mold chuck 32 has three suction grooves 31 arranged in parallel from the inside toward the outside on each of four regions (a first region 35a to a fourth region 35d) of a suction surface 35 in the XY plane. These suction grooves 31 include a first suction groove 31a, a second suction groove 31b, and a third suction groove 31c which are arranged at the first region 35a in the X axis direction and a fourth suction groove 31d, a fifth suction groove 31e, and a sixth suction groove 31f which are arranged at the second region 35b opposite to the first region 35a. Furthermore, the suction grooves 31 include a seventh suction groove 31g, an eighth suction groove 31h, and a ninth suction groove 31i which are arranged at the third region 35c in the Y axis direction and a tenth suction groove 31j, an eleventh suction groove 31k, and a twelfth suction groove 31l which are arranged at the fourth region 35d opposite to the third region 35c. Each of these suction grooves 31 is connected to a vacuum pump 36 via a switching mechanism. When the mold 6 is held by suction, the control unit 5 controls the switching the ON/OFF of suction produced by each of these suction grooves 31 independently of one another. Here, in the example shown in FIG. 5B, the control unit 5 sets the suction produced by two suction grooves 31, which are the first suction groove 31a in the X axis direction and the fourth suction groove 31d opposite to the first suction groove 31a, to "ON". In FIG. 5B, the suction grooves 31 in which vacuum suction is switched "ON" are denoted in black for ease of explanation.

Figure 6A:
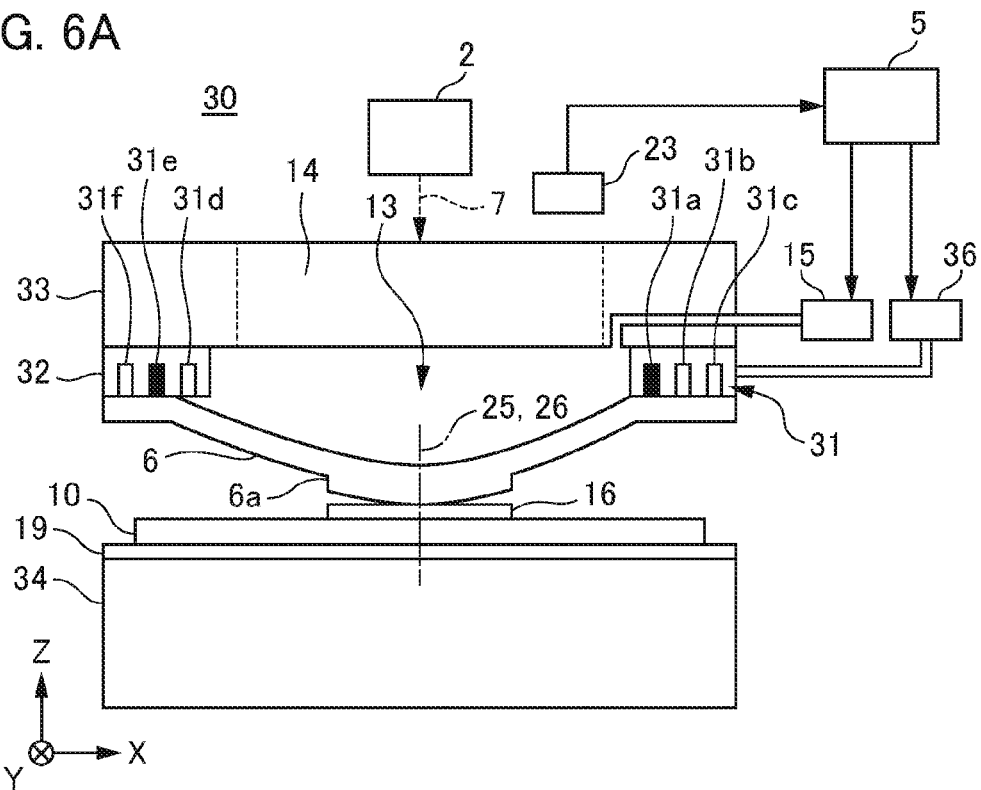
FIGS. 6A and 6B are diagrams illustrating the state of the imprint apparatus according to the second embodiment during the centroid adjustment.
Figure 6B:
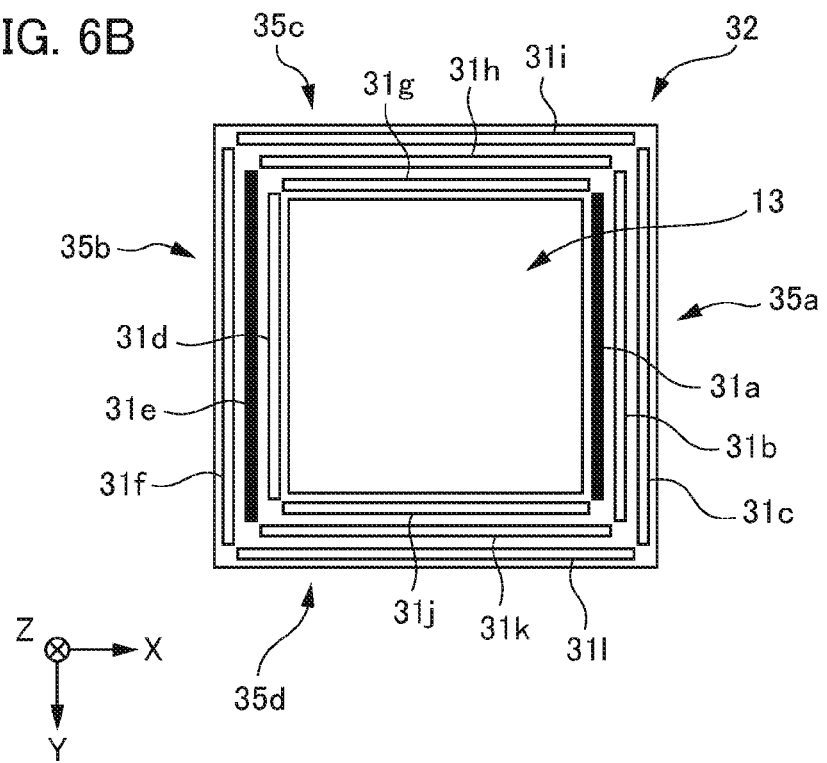

On the other hand, FIGS. 6A and 6B are schematic diagrams illustrating the state of the imprint apparatus 30 according to the present embodiment during the centroid adjustment in a mold-pressing step. In particular, FIG. 6A corresponds to FIG. 5A and FIG. 6B corresponds to FIG. 5B. In the first embodiment, the control unit 5 controls the position of the centroid 25 so as to be always directed toward the position of the center 26 by driving the fine movement stage 18 of the mold drive mechanism 12 in step 5103 in the sequence of operations shown in FIG. 3. In contrast, in the present embodiment, the control unit 5 controls the position of the centroid 25 so as to be always directed toward the position of the center 26 by switching a portion in which vacuum suction is switched "ON" from among the plurality of suction grooves 31 provided in the mold chuck 32. For example, in the example shown in FIG. 6B, the control unit 5 changes the suction state shown in FIG. 5B to the suction state in which the suction produced by the first suction groove 31a remains "ON", but the suction produced by the fourth suction groove 31d is switched "OFF" and the suction produced by the fifth suction groove 31e positioned outwardly adjacent to the fourth suction groove 31d is switched "ON". At this time, selection of the suction grooves 31 is adjusted based on the offset amount between the centroid 25 of the contact region 24 and the center 26 in the XY plane. As described above, the suction operation of a plurality of suction grooves 31 is switched independently of one another. Consequently, the attitude of the pattern section 6a is changed with a change in the deflected shape of the mold 6 so that the position of the centroid 25 of the contact region 24 can be moved during the releasing operation. With this arrangement, according to the present embodiment, the same effects as those of the first embodiment can be obtained.

(Third Embodiment)

Figure 7A:
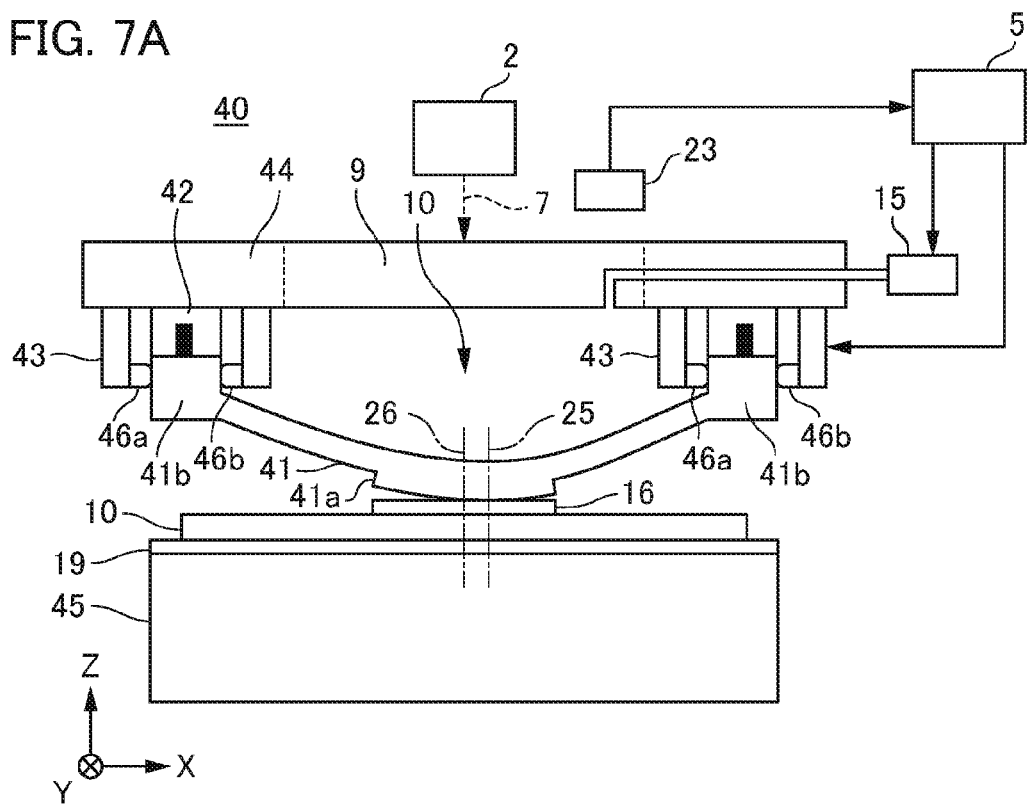
FIGS. 7A and 7B are diagrams illustrating the state of an imprint apparatus according to a third embodiment.
Figure 7B:
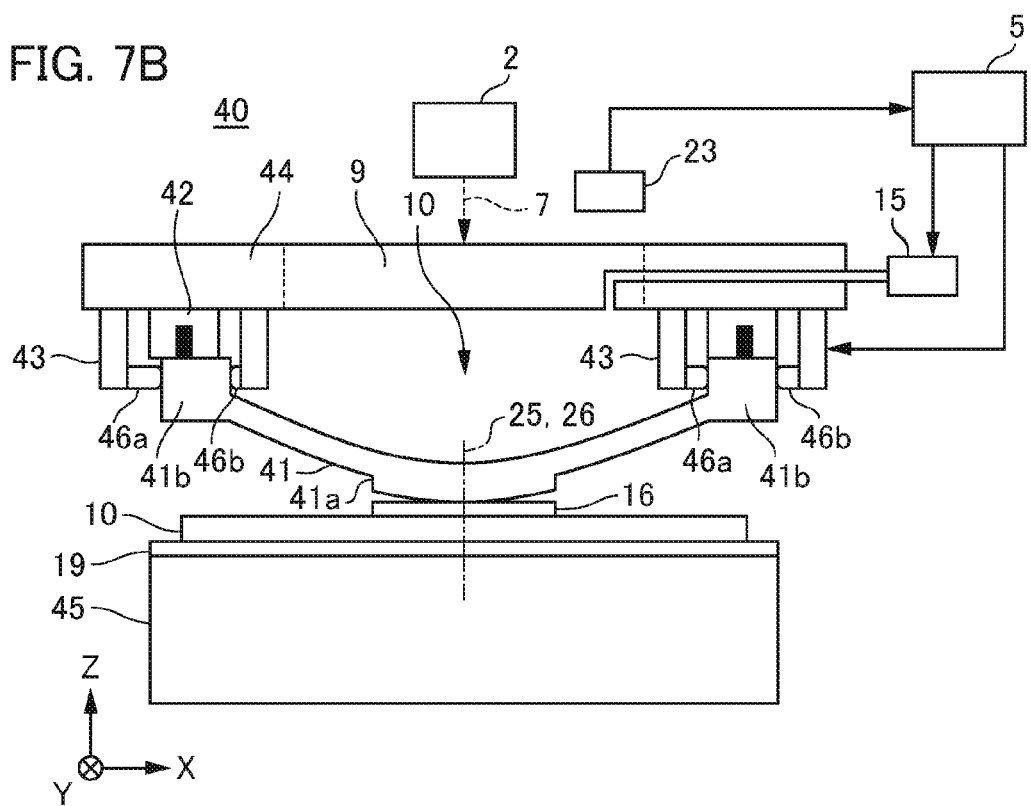

Next, a description will be given of an imprint apparatus according to a third embodiment of the present invention. FIGS. 7A and 7B are schematic diagrams illustrating the state of an imprint apparatus 40 according to the present embodiment prior to the centroid adjustment and during the centroid adjustment in a mold-releasing step. In particular, FIG. 7A is a cross-sectional view illustrating the state of the imprint apparatus 40 prior to the centroid adjustment. In FIG. 7A, the same elements as those in the imprint apparatus 1 of the first embodiment shown in FIG. 1 are designated by the same reference numerals, and the explanation thereof will be omitted. A feature of the imprint apparatus 40 lies in the fact that a moving mechanism 43 that moves a mold 41 in the XY axis direction while holding the mold 41 by suction using a mold chuck 42 is employed as a mechanism that drives the position of the centroid 25 of the contact region 24 so as to be directed toward the position of the center 26 of the resin 16. Also in this case, a mold drive mechanism 44 of the present embodiment, which corresponds to the mold drive mechanism 12 of the first embodiment, may be a unitary drive mechanism that is movable at least in the Z-axis direction instead of one having two drive systems which are a coarse movement stage and a fine movement stage. Likewise, a stage drive mechanism 45 of the present embodiment, which corresponds to the stage drive mechanism 20 of the first embodiment, may also be a unitary drive mechanism that is movable at least in the XY axis direction instead of one having two drive systems which are a coarse movement stage and a fine movement stage.

Firstly, the outer shape of the mold 41 of the present embodiment and the shape of a pattern section 41a thereof are the same as compared with those of the mold 6 of the aforementioned embodiment, but the mold 41 of the present embodiment has a different shape of an outer periphery including a suction surface with respect to the mold chuck 42. In other words, the central portion of the mold 41 is thin so as to be readily deformed into a convex shape toward the wafer 10, and the outer periphery is formed by a thick wall portion 41b. Consequently, the mold 41 may be of a shape in which a cavity (concave portion) of a circular planer shape having a certain depth is formed on the central portion of the surface onto which the ultraviolet light 7 is irradiated. In contrast, the moving mechanism 43 is installed in, for example, the mold drive mechanism 44 and moves the mold 41 to the XY axis direction by independently imparting an external pressure to four wall surfaces of the wall portion 41b. As shown in FIG. 7A, the moving mechanism 43 may include, for example, a pair of abutting rods 46 (46a and 46b) that are in contact with the inside and outside of the wall portion 41b such that the abutting rods 46 are driven by an actuator installed within the moving mechanism 43 in the XY axis direction.

On the other hand, FIG. 7B is a cross-sectional diagram illustrating the state of the imprint apparatus 40 during the centroid adjustment. In the present embodiment, the control unit 5 controls the position of the centroid 25 so as to be always directed toward the position of the center 26 by appropriately adjusting the amount of the four abutting rods 46 to be pushed out by the moving mechanism 43. For example, in the example shown in FIG. 7B, the control unit 5 changes the state of the abutting rods 46 shown in FIG. 7A to the state in which one of the abutting rods 46 remains unchanged in the same state but the other of the abutting rods 46 is pushed out so as to make the wall portion 41b face inward. At this time, the amount of the abutting rod 46 pushed out is adjusted based on the offset amount between the centroid 25 of the contact region 24 and the center 26 in the XY plane. As described above, the deflected shape of the mold 41 is changed by applying an external pressure to the mold 41 using the moving mechanism 43. Consequently, the attitude of the pattern section 41a is changed so that the position of the centroid 25 of the contact region 24 can be moved during the releasing operation. With this arrangement, according to the present embodiment, the same effects as those of the first embodiment can be obtained.

(Fourth Embodiment)

Figure 8:
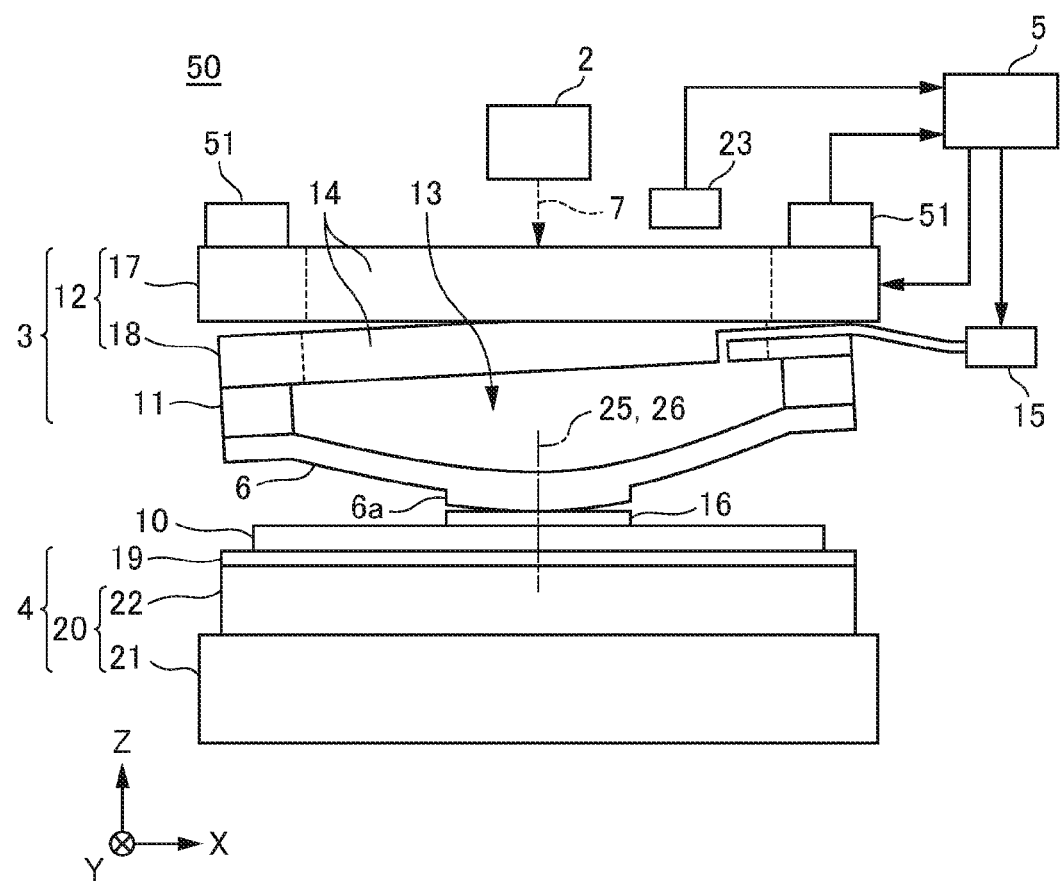
FIG. 8 is a diagram illustrating the state of an imprint apparatus according to a fourth embodiment prior to the centroid adjustment.

Next, a description will be given of an imprint apparatus according to a fourth embodiment of the present invention. FIG. 8 is a schematic diagram illustrating the state of an imprint apparatus 50 according to the present embodiment prior to the centroid adjustment in a mold-releasing step. In FIG. 8, the same elements as those in the imprint apparatus 1 of the first embodiment shown in FIG. 1 are designated by the same reference numerals, and the explanation thereof will be omitted. A feature of the imprint apparatus 50 lies in the fact that the imprint apparatus 50 further includes a load measurement unit 51 in addition to the components provided in the imprint apparatus of the embodiments and suppresses the wafer 10 from being floated up from the wafer chuck 19 during the releasing operation based on the measured value of the load measurement unit 51. In particular, it is preferable that the load measurement unit 51 is capable of measuring the load acting on the mold 6 during the releasing operation. For example, the load measurement unit 51 is a measurement unit such as a load cell or the like, and is disposed between the mold drive mechanism 12 and a fixation unit (e.g., bridge surface plate) (not shown), which is provided in the imprint apparatus 50, for supporting the mold drive mechanism 12. As in the measuring device 23, the load measurement unit 51 is connected to the control unit 5.

In the mold-releasing step of the present embodiment, the control unit 5 firstly acquires image information about the contact region 24 using the measuring device 23 and calculates the area of the contact region 24 based on the acquired image information as in the embodiment. Furthermore, the control unit 5 causes the load measurement unit 51 to measure a load on the mold 6 and acquires the measured value. Here, the area of the contact region 24 based on the image information acquired by the measuring device 23 is represented by "Sc", a load on the mold 6 based on the measured value obtained by the load measurement unit 51 is represented by "Fm", and a suction pressure applied by the wafer chuck 19 when the wafer 10 is held by suction is represented by "−pw". During the releasing operation, the load Fm acts in the direction along which the wafer 10 is released from the wafer chuck 19 via the contact region 24. At this time, when the load Fm is less than a suction force (a value in which the suction pressure is multiplied by the contact area: pw·Sc) generated by the wafer chuck 19, where the suction force acts on the region in the backside of the wafer 10 opposed to the contact region 24, the wafer 10 is normally held by suction by the wafer chuck 19. However, when the load Fm is greater than the suction force pw·Sc, a force acting in the direction along which the wafer 10 is released from the wafer chuck 19 becomes greater than a force for suctioning the wafer 10 to the wafer chuck 19. Consequently, the wafer 10 floats up from the wafer chuck 19. Accordingly, in the present embodiment, the control unit 5 controls the operation of the mold drive mechanism 12 during the releasing operation so as to maintain the relationship of Fm<pw·Sc in the mold-releasing step.

Figure 9A:
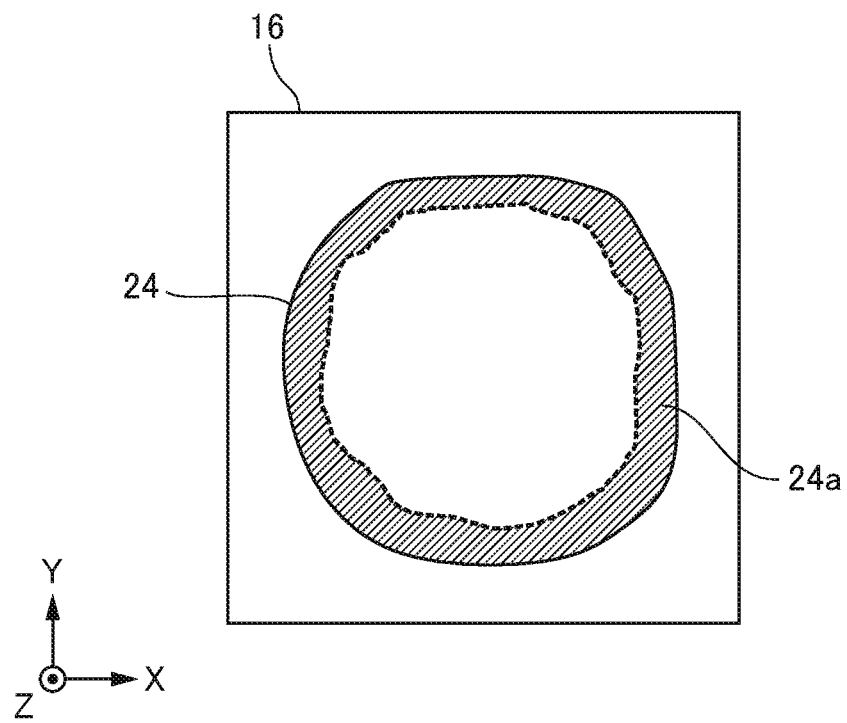
FIGS. 9A and 9B are reference diagrams relating to the operation control of a mold drive mechanism according to the fourth embodiment.
Figure 9B:
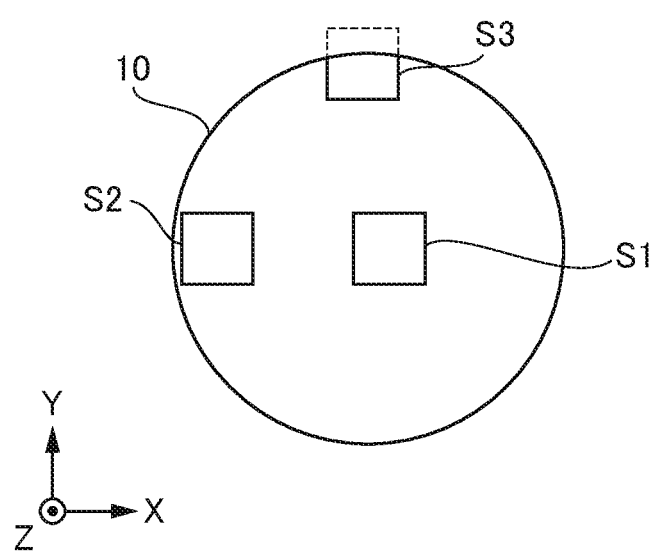

FIGS. 9A and 9B are reference diagrams relating to the operation control of the mold drive mechanism 12 at this time. In particular, FIG. 9A is a plan view illustrating a change in the contact region 24 accompanying the progress of the releasing operation. As described above, the mold 6 is deflected toward the wafer 10 in the convex shape and is gradually peeled off from the end toward the center of the resin 16 during the releasing operation. In other words, as shown in FIG. 9A, when the releasing operation further progresses for the contact region 24, which is at a certain point during the releasing operation, with the elapse of time, the range to be released narrows down as shown by the contact region 24a. The faster the moving speed of the contact region 24 at its boundary when the mold 6 is released from the resin 16, the wider the range to be released over a period of time is, resulting in an increase in the load Fm acting on the mold 6. Thus, the control unit 5 controls the relative speed upon releasing the mold 6 from the resin 16 (the wafer 10), that is, the speed for elevating the mold 6 in the Z-axis direction by the mold drive mechanism 12 in the present embodiment, to thereby properly change the moving speed of the contact region 24 at its boundary. With this arrangement, the load Fm acting on the mold 6 can be adjusted. According to the present embodiment, the same effects as those of the embodiment can be obtained and the wafer 10 can be suppressed from being floated up from the wafer chuck 19 in the mold-releasing step.

In particular, the effects of the present embodiment are preferably produced at a shot S that is present at a specific position on the wafer 10. FIG. 9B is a plan view illustrating the positions of three shots S1, S2, and S3 on the wafer 10 as an example. When imprint processing is performed for the shot S, which is located relatively toward the end of the wafer 10, such as the shot S2 or the shot S3, the present embodiment is particularly preferable. In other words, if the lifting of the wafer 10 can be suppressed at the shot S that is located at the end of the wafer 10, a decrease in the suction force of the wafer chuck 19 due to the external air flow into the gap between the wafer 10 and the wafer chuck 19 can also be suppressed. With this arrangement, the imprint apparatus 50 can avoid a positional shift of the wafer 10 with respect to the wafer chuck 19 or a peel-off of the wafer 10 from the wafer chuck 19 in advance.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-194583 filed Sep. 7, 2011, and Japanese Patent Application No. 2012-111419 filed on May 15, 2012, which are hereby incorporated by reference herein in their entirety.

What is claimed is:

1. An imprint apparatus that forms a pattern of an imprint material on a substrate using a mold, the imprint apparatus comprising:
   an imaging device configured to obtain an image of the imprint material of a contact region at which the mold is brought into contact with the imprint material; and
   a control unit configured to change an angle of a pattern section of the mold with respect to a surface of the substrate, based on the image obtained by the imaging device during a releasing operation in which the mold is released from the imprint material,
   wherein the control unit is further configured to change the angle based on a plane coordinate position of a centroid of the contact region and a plane coordinate position of the center of a pattern-forming region on the substrate.

2. The imprint apparatus according to claim 1, further comprising:
   a deforming unit configured to deform the mold into a convex shape toward the substrate.

3. The imprint apparatus according to claim 1, further comprising:
   a driving unit configured to change the angle of the pattern section of the mold with respect to the surface of the substrate;
   wherein the control unit is further configured to calculate a moving speed of a boundary of the contact region of the imprint material during the releasing operation based on the image and to control the driving unit such that the moving speed is kept constant.

4. The imprint apparatus according to claim 1, further comprising:
   a driving unit configured to change the angle of the pattern section of the mold with respect to the surface of the substrate;
   wherein the driving unit is an actuator that is provided in a mold holding mechanism and is configured to change an angle of a holding surface of the mold in the mold holding mechanism.

5. The imprint apparatus according to claim 1, further comprising:
   a driving unit configured to change an angle of a pattern section of the mold with respect to the surface of the substrate;
   wherein the driving unit is an actuator that is provided in a substrate holding unit and is configured to change an angle of a holding surface of the substrate in the substrate holding unit.

6. The imprint apparatus according to claim 1, further comprising:
   a driving unit configured to change the angle of the pattern section of the mold with respect to the surface of the substrate;
   wherein the driving unit includes a mold holding mechanism and comprises a plurality of suction grooves configured to hold the mold by suction and a switching mechanism configured to switch a suction state of each of the plurality of the suction grooves independently of one another.

7. The imprint apparatus according to claim 1, further comprising:
   a load measurement unit configured to measure a load applied to the mold,
   wherein the control unit is further configured to calculate an area of the contact region during the releasing operation based on the image, and control a relative speed between the substrate and the mold during the releasing operation such that the load does not exceed a value in which a suction pressure applied by a substrate holding unit is multiplied by the area of the contact region.

8. An imprint apparatus that forms a pattern of an imprint material on a substrate using a mold, the imprint apparatus comprising:
   a mold holding mechanism configured to hold the mold;
   a substrate holding unit configured to hold the substrate;
   an imaging device configured to obtain an image of a contact region at which the mold deformed into a convex shape toward the substrate is brought into contact with the imprint material;
   a driving unit configured to change an angle of a holding surface of the mold in the mold holding mechanism with respect to a holding surface of the substrate in the substrate holding unit; and
   a control unit configured to control the driving unit such that the angle is changed, based on the image obtained by the imaging device during a releasing operation in which the mold is released from the imprint material,
   wherein the control unit is further configured to control the driving unit such that the angle is changed, based on a plane coordinate position of a centroid of the contact region and a plane coordinate position of the center of a pattern-forming region on the substrate.

9. The imprint apparatus according to claim 1, wherein the control unit is configured to determine the angle of the pattern section of the mold with respect to the surface of the substrate, based on the image obtained by the imaging device, and change the angle based on the determined angle.

10. The imprint apparatus according to claim 8, further comprising:
    a load measurement unit configured to measure a load applied to the mold,
    wherein the control unit is further configured to calculate an area of the contact region during the releasing operation based on the image, and control a relative speed between the substrate and the mold during the releasing operation such that the load does not exceed a value in which a suction pressure applied by the substrate holding unit is multiplied by the area of the contact region.

11. The imprint apparatus according to claim 8, further comprising:
    a deforming unit configured to deform the mold held by the mold holding mechanism into the convex shape toward the substrate.

12. The imprint apparatus according to claim 8,
wherein the control unit is further configured to calculate a moving speed of a boundary of the contact region during the releasing operation based on the image and to control the driving unit such that the moving speed is kept constant.

13. The imprint apparatus according to claim 8,
wherein the driving unit is an actuator that is provided in the mold holding mechanism and is configured to change the angle of the holding surface of the mold in the mold holding mechanism.

14. The imprint apparatus according to claim 8,
wherein the driving unit is an actuator that is provided in the substrate holding unit and is configured to change the angle of the holding surface of the substrate in the substrate holding unit.

15. The imprint apparatus according to claim 8,
wherein the driving unit includes the mold holding mechanism and comprises a plurality of suction grooves configured to hold the mold by suction and a switching mechanism configured to switch a suction state of each of the plurality of the suction grooves independently of one another.

16. The imprint apparatus according to claim 8, wherein the control unit is configured to determine the angle of a holding surface of the mold in the mold holding mechanism with respect to a holding surface of the substrate in the substrate holding unit, based on the image obtained by the imaging device, and control the driving unit to change the angle, based on the determined angle.

17. An imprint method for forming a pattern of an imprint material on a substrate using a mold, the imprint method comprising steps of:

obtaining an image of the imprint material of a contact region at which the mold is brought into contact with the imprint material; and changing an angle of a pattern section of the mold with respect to a surface of the substrate, based on the obtained image during a releasing operation in which the mold is released from the imprint material, wherein the angle is changed based on a plane coordinate position of a centroid of the contact region and a plane coordinate position of the center of a pattern-forming region on the substrate.

18. An article manufacturing method comprising steps of:

forming a pattern in a substrate using the imprint apparatus that forms a pattern of an imprint material on the substrate using a mold; and processing the substrate on which the pattern has been formed in the forming step, wherein the imprint apparatus comprises:

an imaging device configured to obtain an image of the imprint material of a contact region at which the mold is brought into contact with the imprint material; and a control unit configured to change an angle of a pattern section of the mold with respect to a surface of the substrate, based on the image obtained by the imaging device during a releasing operation in which the mold is released from the imprint material, wherein the control unit is further configured to change the angle based on a plane coordinate position of a centroid of the contact region and a plane coordinate position of the center of a pattern-forming region on the substrate.

\* \* \* \* \*